(12) United States Patent
Hargreaves et al.

(10) Patent No.: US 7,187,170 B1
(45) Date of Patent: Mar. 6, 2007

(54) MULTIPLE ACQUISITION PHASE-SENSITIVE SSFP FOR SPECIES SEPARATING IN MRI

(75) Inventors: Brian A. Hargreaves, Menlo Park, CA (US); Neal K. Bangerter, Woodinville, WA (US)

(73) Assignee: The Board of Trustees of the Leland Stanford Junior Univeristy, Palo Alto, CA (US)

( * ) Notice: Subject to any disclaimer, the term of this patent is extended or adjusted under 35 U.S.C. 154(b) by 0 days.

(21) Appl. No.: 11/225,920

(22) Filed: Sep. 13, 2005

(51) Int. Cl.
*G01V 3/00* (2006.01)
(52) U.S. Cl. ...................................... 324/307; 324/309
(58) Field of Classification Search ................ 324/307, 324/309
See application file for complete search history.

(56) References Cited

U.S. PATENT DOCUMENTS

| | | | |
|---|---|---|---|
| 4,769,603 | A | 9/1988 | Oppelt et al. |
| 5,144,235 | A | 9/1992 | Glover et al. |
| 5,225,781 | A | 7/1993 | Glover et al. |
| 5,541,514 | A | 7/1996 | Heid et al. |
| 6,307,368 | B1 | 10/2001 | Vasanawala et al. |
| 6,339,332 | B1 | 1/2002 | Deimling |
| 6,366,090 | B1 | 4/2002 | Heid |
| 6,369,569 | B1 | 4/2002 | Heid |
| 6,906,516 | B2 * | 6/2005 | Bangerter et al. .......... 324/309 |
| 6,922,054 | B2 * | 7/2005 | Hargreaves et al. ........ 324/307 |

OTHER PUBLICATIONS

Hargreaves et al., "Dual-Acquisition Phase-Sensitive Fat-Water Separation using Balanced SSFP", 31 pages, unpublished, May 3, 2005.
Hargreaves et al., "Multiple-Acquisition Phase-Sensitive SSFP Water-Fat Separation", Thirteenth Scientific Meeting, ISMRM, May 2005, p. 2385.

* cited by examiner

*Primary Examiner*—Louis M. Arana
(74) *Attorney, Agent, or Firm*—Bever Weaver LLP

(57) ABSTRACT

MRI signals from two species such as fat and water are separated by repeatedly applying a steady state free precession (SSFP) sequence to an object with the phase of each RF excitation pulse in a sequence being increased by $2\pi n/N$ radians on each repetition, where acquisition number n ranges from 1 to N. Alternatively, center frequency for each scan is incremented compared with the first scan center frequency. Images are reconstructed from the acquired signals and summed. Slowing varying phase due to sources other than chemical shift can be removed. Species signals are separated based on phase (sign) of the summed image signals.

17 Claims, 5 Drawing Sheets

MULTIPLE ACQUISITION PHASE-SENSITIVE SSFP FOR SPECIES SEPARATING IN MRI

GOVERNMENT RIGHTS

The U.S. government has rights in the disclosed invention pursuant to NIH grants to Stanford University including NIH-5R01HL075803-02, and NIH-5R01HL067161-02.

BACKGROUND OF THE INVENTION

This invention relates generally to magnetic resonance imaging (MRI), and more particularly the invention relates to separation of signals from species (e.g. water/fat) using steady state free precession (SSFP) imaging.

Magnetic resonance imaging (MRI) provides excellent soft tissue contrast with arbitrary scan-volume orientations, thus making MRI an extremely useful medical imaging modality. However, in many applications, MRI is limited by long scan times, limited spatial resolution, and contrast between lipid-based tissue and water-based tissue. Recent advances in gradient amplifier technology have enabled the use of fully-refocused steady-state free precession (SSFP) imaging methods. SSFP imaging is a very fast method that can provide good tissue contrast and high resolution. A number of commercial implementations of SSFP are available, all of which are conceptually identical.

As illustrated in FIG. 1, a refocused SSFP sequence consists of a single RF excitation which is repeated periodically. All gradients used for slice selection or imaging are fully rewound over each repetition time, TR. In the steady-state, the magnetization at points a and d is the same. Magnetization is tipped about the x-axis through an angle α. Between excitations, the magnetization undergoes a precession by an angle $\theta=2\pi\Delta fTR$ about the z-axis, where f is the tissue off-resonance, and also experiences both T1 and T2 relaxation.

During the sequence each spin is affected by RF pulses, relaxation and free precession. The steady-state magnetization for SSFP is a function of the sequence parameters flip angle (a), repetition time (TR) and echo time (TE) as well as the tissue parameters T1, T2, and off-resonant frequency $\Delta f$.

Magnetic resonance imaging (MRI) is widely used for clinical diagnosis of neurological, cardiovascular, and musculoskeletal disorders. However, these and other applications of MRI are still limited by spatial resolution, signal-to-noise ratio (SNR) and imaging speed. Balanced steady-state free precession (SSFP) provides good tissue contrast with high signal-to-noise ratio, thus addressing the latter two limitations of MRI. Historically, there have been two major difficulties regarding clinical use of balanced SSFP. The first of these is the high sensitivity of the signal to resonance frequency variations caused by static field inhomogeneity, chemical shift, and susceptibility shifts. The second difficulty is the high signal produced by fat, which can obscure visualization of normal and abnormal tissue.

Traditionally, the best approach for reducing the sensitivity to frequency variations has been to reduce the repetition time (TR) of the sequence so that precession over one TR is small, and a wider frequency variation can be tolerated. However, this is ultimately limited by a combination of gradient amplifier speed, patient stimulation effects and RF heating of the subject. An alternative to decreasing the TR has been to perform multiple acquisitions with different center frequencies.

Numerous methods have been presented to suppress the fat signal, or to separate it from the water signal. Many of these methods require multiple acquisitions, or otherwise increased scan time. Some of the faster methods can suffer from transient artifacts.

Although it suffers from partial-volume effects, one of the fastest, and most efficient fat-water separation techniques is phase-sensitive SSFP, which uses the signal phase in a standard balanced SSFP acquisition to separate water and fat. However, like other SSFP fat/water separation methods, phase-sensitive SSFP fails in the presence of significant frequency variations. The present invention is directed to overcoming this limitation.

SUMMARY OF THE INVENTION

This invention efficiently separates species signals (e.g. fat and water) in balanced SSFP imaging, while mitigating the effects of frequency variations. Multiple images are acquired using a standard SSFP sequence. The complex image data are combined using appropriate phasing where necessary, and passed through a phase correction algorithm that leaves a sign change between fat and water voxels. The sign change allows simple separation of fat and water (or other species based on resonant frequency difference).

The invention and objects and features thereof will be more readily apparent from the following detailed description and appended claims when taken with the drawings.

DETAILED DESCRIPTION OF THE PREFERRED EMBODIMENTS

Figure 1:
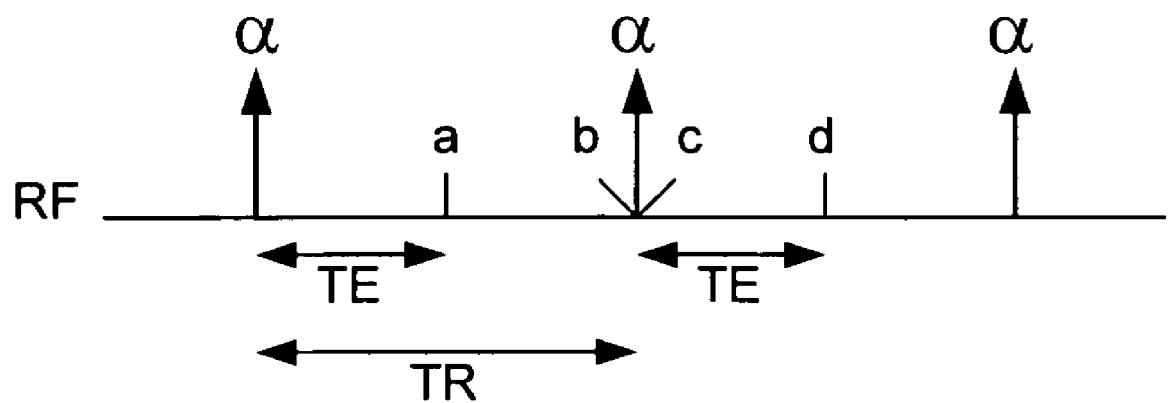
FIG. 1 illustrates a refocused SSFP sequence including a simple RF excitation pulse which is repeated periodically.
Figure 2:
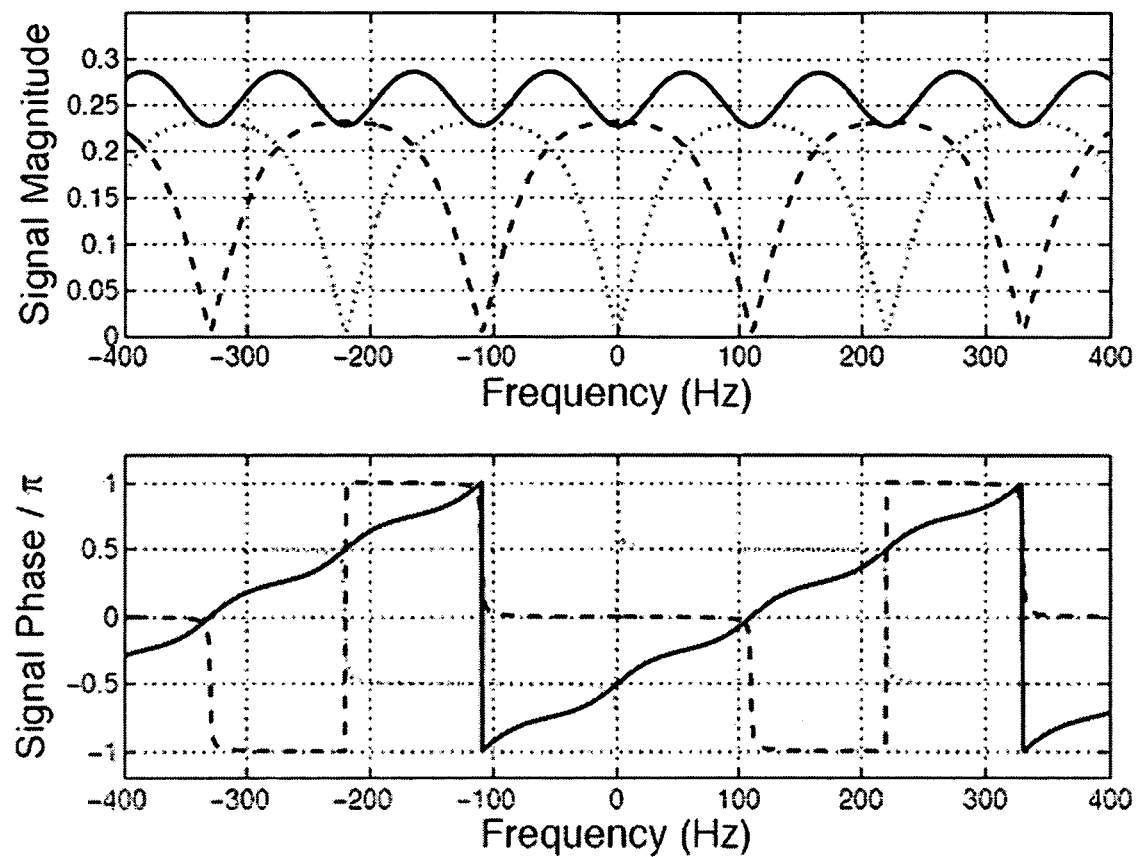
FIG. 2 illustrates magnitude and phase of balanced SSFP acquisition using 0° and 180° RF phase increments in accordance with an embodiment of the invention.
Figure 3A:
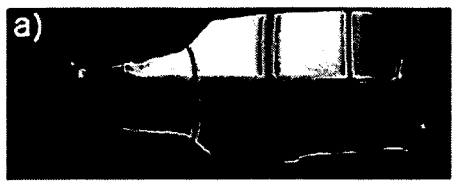
FIGS. 3(a)–3(j) illustrate magnitude and phase images for phantom images with RF phase increments of 0° and 180° in accordance with an embodiment of the invention.
Figure 3B:
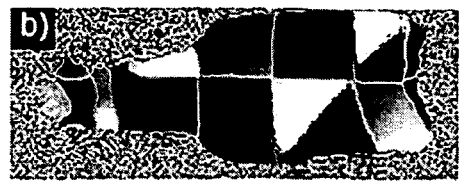
Figure 3C:
Figure 3D:
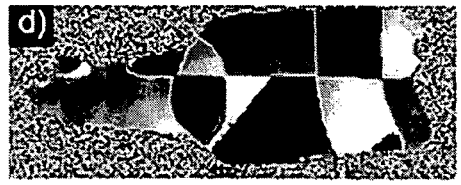
Figure 3E:
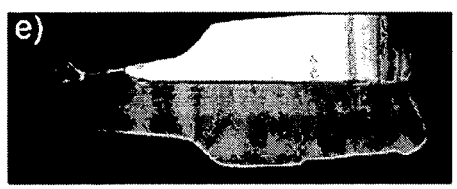
Figure 3F:
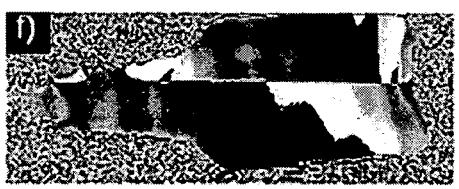
Figure 3G:
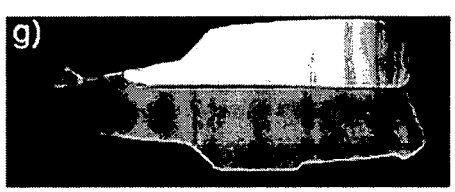
Figure 3H:
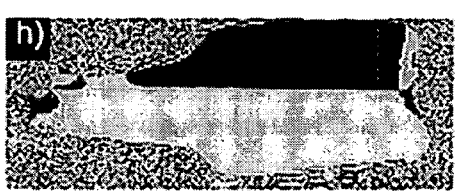
Figure 3I:
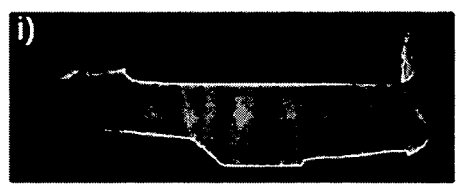
Figure 3J:
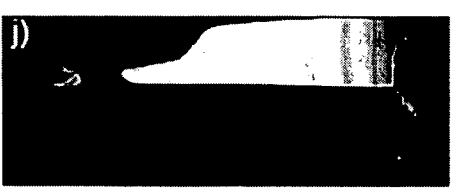

In balanced SSFP with TR=2TE, the signal is refocused to a spin echo, with a sign that alternates with frequency spacing 1/TR. Placing water and fat in signal bands with opposite sign allows separation using the sign. FIG. 2 illustrates magnitude (top) and phase (bottom) of balanced SSFP acquisitions with RF phase increment of 0° (dotted line) and 180° (dashed line), and of the complex sum signal (solid line). FIG. 1 shows (with TR=2TE=4.6 ms) that the complex addition of two images with RF phase increasing by 180° (dashed line) and 0° (dotted line) yields a signal with nearly linear phase, fairly smooth magnitude, and water and fat 180° out of phase at 1.5 T regardless of field variation. This addition is intuitively approximated by the sum in the complex exponential, $e^{i\omega}=\cos(\omega)+i\sin(\omega)$. It should be noted that applying a different phase increment is similar to changing the center frequency of the scan. Both methods can be used to produce the above signal, with appropriate phasing when combining the signals.

Assuming a reasonably slowly-varying field, the resulting phase can be removed using phase-correction methods as follows: Each complex voxel is squared to remove the water/fat 180° ambiguity. The phase angle is fitted, then divided by two. Finally, the phase is flipped by 180° as necessary, to constrain it to vary slowly in space. This phase is removed, leaving a predominantly real-valued signal with a sign change between water and fat, allowing their separation.

In accordance with an embodiment of the invention, data acquisition uses a standard balanced SSFP imaging sequence, with TR=1/Δf and TE=TR/2, where TR is the sequence repetition time, TE is the echo time, and Δf is the frequency difference between fat and water, about 220 Hz at 1.5 Tesla. The sequence is repeated for N acquisitions, with the acquisition number n ranging from 1 to N. On the nth acquisition, the phase of each RF excitation pulse is increased by 2πn/N radians on each repetition (or the center frequency is shifted by 1/(2NTR). All other parameters are kept the same for all acquisitions. Following a standard Fourier reconstruction for each acquisition, the N complex images are added (with appropriate phasing if necessary) to form the combined signal, $S_c$. For reasonable imaging parameters, the phase of $S_c$ is approximately linear as a function of the resonant frequency. The magnitude and phase of the individual signals and of $S_c$ are shown for N=2 in FIG. 2. Note that the phase difference changes by exactly 180° as the resonant frequency changes by Δf, or 220 Hz.

For Fat/Water separation beginning with the combined signal, Sc, shown by the solid line in FIG. 2, we assume that the resonant frequency changes from all sources except chemical-shift are slowly-varying in space. The slowly-varying phase is removed by a four-step process:

1. The 3D image is divided into blocks, for example 4×4×4 or 8×8×8 voxels per block.
2. A phase is assigned to each block, equal to one half of the phase of the sum of the squares of the complex voxel values in the block.
The squaring of values allows the phase to be fitted without removing the sign change. The resulting block phase value is between −90° and 90°.
3. For every block, a correction phase is assigned as the negative of the block phase.
4. Growing outward from a starting block, at each block, the neighbor correction is calculated as a weighted average of the correction factors for the neighboring blocks.
5. If the block correction phase differs by more than 90° from the neighbor correction, 180° is added to the correction factor.
6. The block correction phase is added to the phase of all voxels in that block. This is repeated for all blocks.

Following this phase correction process, the voxels with a phase angle within 90° of 0° (i.e. −90° to +90°) are considered water voxels, while voxels with a phase angle within 90° of 180° (i.e. −90° to +270°) are considered fat voxels. The voxels in the image are thus separated into fat and water images. There may be an ambiguity whereby fat and water images must be swapped. Although resolving this ambiguity is not covered in this invention, this is not a major problem since it is obvious that the images are swapped.

The acquisition and phase separation described above has been tested by scanning a bottle containing oil and water, laid on its side. FIGS. 3(a)–3(j) show magnitude and phase images of the bottle after acquisition, and at different stages of phase correction before the final separated fat and water images.

Figures 4A, 4B, 4C:
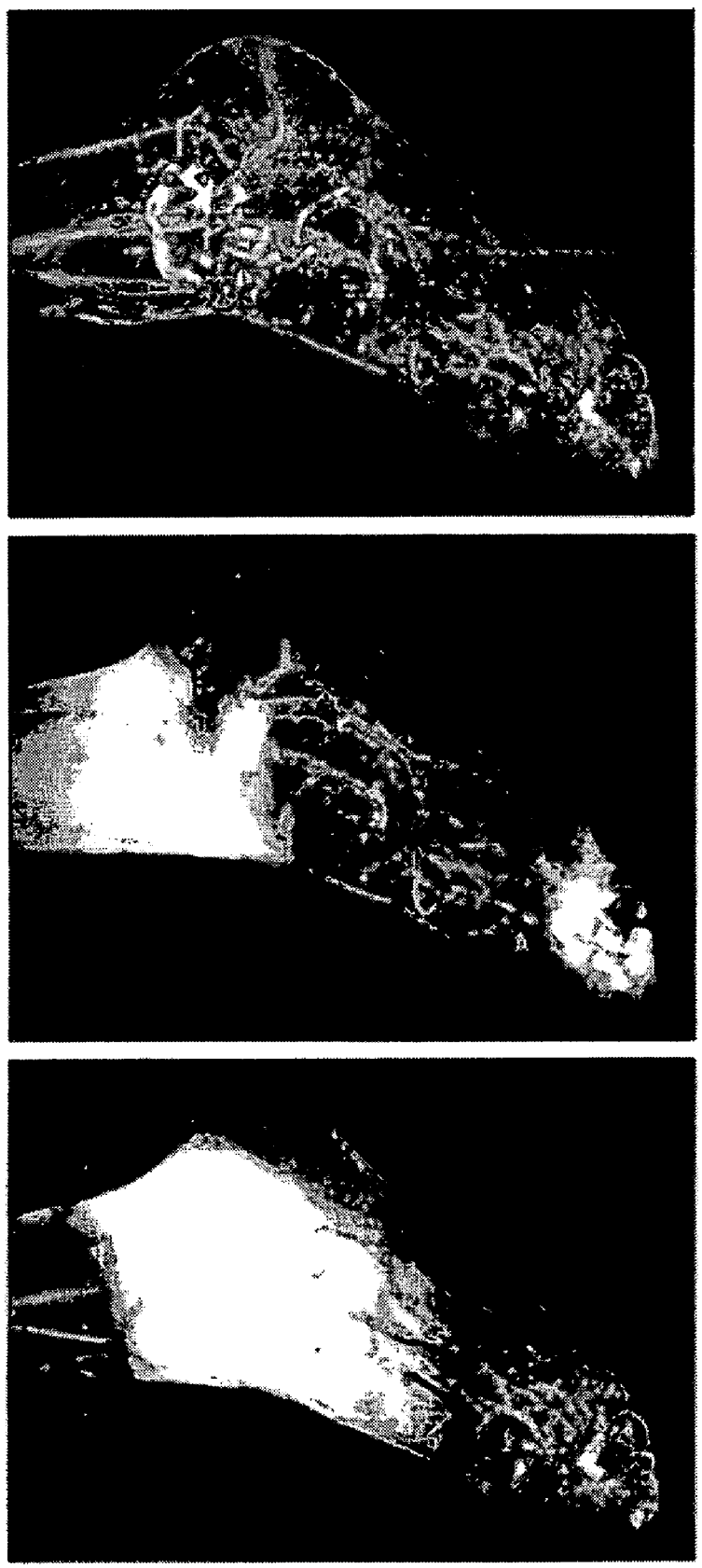
FIGS. 4(a)–4(c) illustrate MIP images of a foot, the foot with water-fat separation, and the sum of images in accordance with the invention, respectively.
Figure 5A:
FIGS. 5(a)–5(j) illustrate magnitude and phase image for the lower leg of two volunteers with RF phase increments of 0° and 180° in accordance with an embodiment of the invention.
Figure 5B:
Figure 5C:
Figure 5D:
Figure 5E:
Figure 5F:
Figure 5G:
Figure 5H:
Figure 5I:
Figure 5J:

A useful application of this technique is magnetic resonance angiography of the periphery. In the foot, susceptibility shifts cause resonant frequency variations that can make balanced SSFP imaging difficult. It is desirable to use a water-only image, and view a maximum intensity projection that shows the vasculature. Single acquisition phase-sensitive SSFP would seem to be a good method of achieving this. However, the large frequency variations result in incorrect fat/water separation, as shown in FIGS. 4a and 4b, which are maximum-intensity projections of images of a normal foot, following phase-sensitive fat/water separation. The left and center images show the case where phase-sensitive separation is performed on individual acquisitions with RF phase increments of 0° and 180° respectively. In both cases, the resonance variation is enough that fat and water are not separated, leading to the very bright signal from subcutaneous fat. However, when the phase-sensitive fat/water separation is applied to the sum of the two images, the subcutaneous fat signal is completely removed, as shown by the image on the right. However, using the multiple acquisition technique described herein, perfect fat/water separation is possible, resulting in the image shown on the right.

At 3.0 T, we imaged the lower leg of two normal volunteers, using TR=2TE=11.9 ms, thus placing water and fat 5 signal bands apart. Other parameters were a 50° flip angle, 512×240×96 matrix, 0.5×0.7×1.0 mm3 resolution, and two (0° and 180° RF phase increment) acquisitions for a total scan time of 9:10. FIGS. 5(a)–5(j) show the 0° and 180° images, and the reconstruction process. The magnitude and phase variations from null signal bands (shown by arrows) are removed by the complex image sum and phase correction, permitting accurate separation of water and fat.

At 1.5 T, we imaged the feet of three normal volunteers with the goal of a maximum-intensity projection (MIP) angiographic image. Scan parameters were TR=2TE=4.6 ms, 60° flip angle, 1.0×1.0×1.0 mm3 resolution, and two (0° and 180°) acquisitions (5:11 total scan time). FIG. 4C shows that the complex sum enables the correct MIP while the original phase-sensitive SSFP method fails due to field variations.

There are several variations for embodiments of this technique:

1. The number of acquisitions, N, can be increased from 2 to 3 or more. Although this reduces the ripple in the phase of the combined signal Sc, the overall SNR efficiency decreases, and the minimum scan time increases.
2. Other techniques of removing slowly-varying phase can be implemented instead of the specific embodiment described. For example, the phase correction could be applied to individual acquisitions before combination. Alternative decision algorithms are also possible.
3. The repetition time can be chosen to result in a phase difference between fat and water other than 180°. Phase differences such as 90°, 270° or 540° can all be used in different ways to separate tissues based on resonance frequency.

Balanced SSFP imaging with fat/water separation and reduced sensitivity to resonance frequency variations is essential for numerous medical imaging applications. The invention described here allows many SSFP applications which are otherwise limited by gradient speed, spatial resolution requirements, RF heating, and susceptibility variations.

While the invention has been described with reference to specific embodiments, the description is illustrative of the invention and is not to be construed as limiting the invention. Various modifications and applications may occur to those skilled in the art without departing from the true scope and spirit of the invention as defined by the appended claims.

What is claimed is:

1. A method of separating magnetic resonance image (MRI) signals from two species in an object being imaged comprising the steps of:
    a) applying a first steady state free precession (SSFP) sequence to the object,
    b) acquiring first magnetic resonance signals from the object in response to the first SSFP sequence,
    c) reconstructing an image signal based on the acquired signals,
    d) repeating steps a), b) and c) for N acquisitions, with an acquisition number n ranging from 1 to N, the phase of each RF excitation pulse being increased by $2\pi n/N$ radians on each repetition,
    e) summing all reconstructed image signals, and
    f) separating species image signals based on phase of the summed image signals.

2. The method of claim 1 and further including before step f) the step of removing slowly-varying phase due to slowly-varying magnetic field.

3. The method of claim 2 wherein the step of removing slowly-varying phase includes:
    i) dividing the image into blocks with a plurality of voxels per block,
    ii) assigning a phase to each block based on the phase of voxels in the block,
    iii) assigning a correction phase to each block as the negative of the block phase,
    iv) calculating a neighbor correction for each block as a weighted average of correction phases for all neighbor blocks,
    v) if a block correction phase differs by more than 90° from the neighbor correction, add 180° to the neighbor correction,
    vi) add the block correction phase to the phase of all voxels in each block.

4. The method of claim 3 wherein in step ii) the phase for each block equals one half of the phase of the sum of the squares of all complex voxel values in the block.

5. The method of claim 4 wherein step c) includes Fourier reconstruction of the acquired signal.

6. The method of claim 2 wherein step c) includes Fourier reconstruction of the acquired signal.

7. The method of claim 1 wherein step c) includes Fourier reconstruction of the acquired signal.

8. The method of claim 1 wherein N equals two and phases differ by 180°.

9. The method of claim 1 wherein the two species are water and fat.

10. The method of claim 1 wherein N equals two and phases differ by an amount different from 180°.

11. A method of separating magnetic resonance image (MRI) signals from two species in an object being imaged comprising the steps of:
    a) applying a first steady state free precession (SSFP) sequence to the object,
    b) acquiring first magnetic resonance signals from the object in response to the first SSFP sequence,
    c) reconstructing an image signal based on the acquired signals,
    d) repeating steps a), b), and c) for N acquisitions with an acquisition number n ranging from 1 to N, the center frequency of each repeat acquisition in step b) being incremented by $1/(2NTR)$ relative to the first acquisition,
    e) summing all reconstructed image signals, and
    f) separating species image signals based on phase of the summed image signals.

12. The method of claim 11 and further including before step f) the step of removing slowly-varying phase due to slowly-varying magnetic field.

13. The method of claim 12 wherein the step of removing slowly-varying phase includes:
    i) dividing the image into blocks with a plurality of voxels per block,
    ii) assigning a phase to each block based on the phase of voxels in the block,
    iii) assigning a correction phase to each block as the negative of the block phase,
    iv) calculating a neighbor correction for each block as a weighted average of correction phases for all neighbor blocks,
    v) if a block correction phase differs by more than 90° from the neighbor correction, add 180° to the neighbor correction,
    vi) add the block correction phase to the phase of all voxels in each block.

14. The method of claim 13 wherein in step ii) the phase for each block equals one half of the phase of the sum of the squares of all complex voxel values in the block.

15. The method of claim 11 wherein step c) includes Fourier reconstruction of the acquired signal.

16. The method of claim 11 wherein N equals 2 and the center frequencies differ by $0.5/TR$.

17. A method of separating magnetic resonance image (MRI) signals from two species in an object being imaged comprising the steps of:
    a) applying a first steady state free precession (SSFP) sequence to the object,
    b) acquiring first magnetic resonance signals from the object in response to the first SSFP sequence,
    c) reconstructing an image signal based on the acquired signal,
    d) repeating steps a), b) and c) for N repeat acquisitions, the phase of each RF excitation pulse being increased on each acquisition and the center frequency of the nth repeat acquisition being incremented so that summed reconstructed image signals can be separated based on phase of the summed signals,
    e) summing all reconstructed image signals,
    f) separating species image signals based on phase of the summed image signals.

* * * * *

UNITED STATES PATENT AND TRADEMARK OFFICE
CERTIFICATE OF CORRECTION

Page 1 of 1

PATENT NO. : 7,187,170 B1
APPLICATION NO. : 11/225920
DATED : March 6, 2007
INVENTOR(S) : Hargreaves et al.

It is certified that error appears in the above-identified patent and that said Letters Patent is hereby corrected as shown below:

Column 1:

• Please replace lines 5-9 with:

-- FEDERALLY-SPONSORED RESEARCH OR DEVELOPMENT
This invention was made with Government support under contracts HL075803, HL067161, and EB002524 awarded by the National Institutes of Health. The Government has certain rights in this invention. --

Signed and Sealed this
Nineteenth Day of April, 2011

David J. Kappos
*Director of the United States Patent and Trademark Office*